United States Patent

[19]

Rife

[11] Patent Number: 6,075,699

[45] Date of Patent: Jun. 13, 2000

[54] HEAT SINK ASSEMBLY WITH SNAP-IN LEGS

[75] Inventor: William B. Rife, Greenville, R.I.

[73] Assignee: Chip Coolers, Inc., Warwick, R.I.

[21] Appl. No.: 09/239,912

[22] Filed: Jan. 29, 1999

[51] Int. Cl.[7] .................................................. H05H 7/20
[52] U.S. Cl. ........................ 361/704; 165/80.2; 174/16.3; 257/727; 361/710; 361/719
[58] Field of Search ................... 165/80.2, 80.3, 165/185; 174/16.3; 257/706–707, 712–713, 718–719, 727; 361/704, 707, 709–710, 714–718, 722

[56] References Cited

U.S. PATENT DOCUMENTS

| | | | |
|---|---|---|---|
| Re. 35,573 | 7/1997 | Clemens | 257/719 |
| 2,916,159 | 12/1959 | O'Neill | 211/89 |
| 3,033,537 | 5/1962 | Brown, Jr. | 257/263 |
| 3,229,756 | 1/1966 | Keresztury | 165/67 |
| 4,345,267 | 8/1982 | Corman et al. | 357/81 |
| 4,607,685 | 8/1986 | Mitchell, Jr. | 165/80.3 |
| 4,660,123 | 4/1987 | Hermann | 361/386 |
| 4,745,456 | 5/1988 | Clemens | 357/79 |
| 5,132,875 | 7/1992 | Plesinger | 361/704 |
| 5,313,099 | 5/1994 | Tata et al. | 257/717 |
| 5,397,919 | 3/1995 | Tata et al. | 257/717 |
| 5,566,052 | 10/1996 | Hugher | 361/704 |
| 5,586,005 | 12/1996 | Cipolla et al. | 361/719 |
| 5,667,870 | 9/1997 | McCullough | 257/718 |
| 5,708,564 | 1/1998 | Lin | 361/704 |
| 5,969,947 | 10/1999 | Johnson et al. | 361/704 |

FOREIGN PATENT DOCUMENTS

| | | |
|---|---|---|
| 0130279A3 | of 0000 | European Pat. Off. . |
| 295 16 627 U1 | 12/1995 | Germany . |
| 58-176959 | 10/1983 | Japan . |

*Primary Examiner*—Gregory Thompson
*Attorney, Agent, or Firm*—Barlow, Josephs & Holmes, Ltd.

[57] ABSTRACT

A heat sink assembly, having a number of mounting holes therethrough, is installed on a heat generating surface of an electronic component for removing heat therefrom. A retaining clip has a central member and a number of legs which depending downwardly from the central member with ends of the legs not connected to the central member being free ends. Retention members are provided on each of the free ends of the legs to prevent the legs from being removed from their respective mounting holes. A heat dissipating member, having a threaded base portion is threadably received in a bore in the central member so that the flat bottom surface of the heat dissipating member is in flush thermal communication with the electronic component while the legs are secured within their respective holes in the electronic component.

20 Claims, 6 Drawing Sheets

HEAT SINK ASSEMBLY WITH SNAP-IN LEGS

BACKGROUND OF THE INVENTION

The present invention relates generally to electronic solid state and integrated circuit devices. More specifically, the present invention relates to apparatuses for dissipating heat generated by such devices.

In the electronics and computer industries, it has been well known to employ various types of electronic device packages and integrated circuit chips, such as the PENTIUM central processing unit chip (CPU) manufactured by Intel Corporation and RAM (random access memory) chips. These integrated circuit chips have a pin grid array (PGA) package and are typically installed into a socket which is soldered to a computer circuit board. These integrated circuit devices, particularly the CPU microprocessor chips, generate a great deal of heat during operation which must be removed to prevent adverse effects on operation of the system into which the device is installed. For example, a PENTIUM microprocessor, containing millions of transistors, is highly susceptible to overheating which could destroy the microprocessor device itself or other components proximal to the microprocessor.

In addition to the PENTIUM microprocessor discussed above, there are many other types of semiconductor device packages which are commonly used in computer equipment, for example. Recently, various types of surface mount packages, such as BGA (ball grid array) and LGA (land grid array) type semiconductor packages have become increasingly popular as the semiconductor package of choice for computers.

In addition, microprocessors are commonly being installed onto a circuit board which is, in turn, installed into a motherboard or other similar primary circuit board. For example, microprocessors, such as the Pentium II and the Celeron from Intel, are "processor cards" which are installed into a motherboard of a computer in similar fashion to the way a modem is installed into a motherboard. On a given processor card is typically the processor semiconductor device package itself along with any other chips or semiconductor devices that are necessary for the operation of the card, such cache chips, or the like. The processor package may be installed into the processor card via a pin grid, ball grid, land grid array and with a socket such as a ZIF or ball grid socket.

In similar fashion to the earlier semiconductor devices discussed above, the processor cards like the Pentium II and Celeron also suffer from excessive generation of heat. In particular, the processor semiconductor device package on the card generates the heat which is of most concern. A given surface of the component will, as a result, be very hot. If such heat is not properly dissipated, the processor semiconductor device package and the entire processor card or component will eventually fail. Understanding the need for heat dissipation and the connection of heat sinks, the manufacturers of processor cards typically include holes completely or partially through the processor card to facilitate the installation of heat sink assemblies thereto. Commonly, an array of at least four holes are present to receive heat sink devices.

In view of the foregoing, efforts have been made to supply a heat dissipating member, such as a heat sink, into thermal communication with the processor card and more specifically, the processor semiconductor device package. These efforts commonly employ the available holes present in the processor card to serve as anchors for the receipt of a heat sink assembly. For example, prior art attempts include an extruded heat sink assembly with a base and an array of fin members emanating upwardly therefrom. The base includes a number of through holes which correspond with the arrangement of the holes provided by the manufacturer of the processor card. The heat sink assembly is secured to the processor card by screws which are hand-tightened to the desired tension and communication between the base of the heat sink and the processor card. These heat sinks attach directly to the heat generating package or the housing containing the package, such as in a Pentium II environment.

In addition, heat sink assemblies have also been available which provide a heat sink base and associated fins along with a spring clip which engages the holes in the processor card and spans across the heat sink base to secure it in place. While relative easy to install, this attempt in the prior art is not capable of custom tension adjustment of communication between the heat sink base and surface to be cooled.

In addition to the processor cards of the prior art, processor semiconductor device packages may also be installed directly into a main circuit board, such a motherboard, in similar fashion to the older Pentium or 486 processor packages. Some manufacturers are also providing through holes in the motherboard itself to permit the attachment of heat sink assemblies as an alternative to attaching the heat sink assembly to the semiconductor package itself or the socket into which it is installed. In similar fashion to the processor cards discusses above, these processor package arrangement suffer from similar problems associated with the attachment of heat sink assemblies to avoid overheating problems.

In view of the foregoing, there is a demand for a heat sink assembly that attach to a heat generating semiconductor device package without attaching to the semiconductor package itself. In addition, there is a demand for a heat sink assembly that can quickly and easily attach to holes provided proximal to the device to be cooled while still being tension adjustable.

SUMMARY OF THE INVENTION

The present invention preserves the advantages of prior art heat sink assemblies for integrated circuit devices, such as microprocessors. In addition, it provides new advantages not found in currently available assemblies and overcomes many disadvantages of such currently available assemblies.

The invention is generally directed to the novel and unique heat sink assembly with particular application in cooling microprocessor integrated circuit devices, such as Pentium II and Celeron semiconductor device packages. The heat sink assembly of the present invention enables the simple, easy and inexpensive assembly, use and maintenance of a heat sink assembly while realizing superior heat dissipation.

The heat dissipating device of the present invention includes a semiconductor package installed on circuit board having a number of holes thereabout. A retaining clip is provided which has a central member and a number of legs depending downwardly from respective opposing ends of the central member with ends of the legs not connected to the central member being free ends. An aperture is disposed through the central member defining a bore having female threading formed therein. The free ends of the legs are secured relative to the semiconductor package with the bore being positioned substantially above the semiconductor package. The free ends of the legs include spring-biased retention members having stops which communicate with respective holes through the circuit board. The legs are permitted to slide within the holes with the stops preventing the legs from being removed from their respective holes.

A heat dissipating member, having a threaded base portion with a substantially flat bottom surface, is adapted to be threadably received in the bore so that the flat bottom surface of the heat dissipating member is in flush thermal communication with the heat generating surface.

In operation, the clip member is installed into the circuit board. The free ends of the legs of the clip are routed through respective corresponding holes in the circuit board so that the free ends carrying the retention members pass through the holes in the circuit board to provide the stop members on the opposing side of the circuit board.

The heat sink member is threaded into the bore of the central member until the bottom surface of the heat sink member communicates with the heat generating surface to a desired tension to provide proper flush thermal communication. As the heat sink member is being threaded into the bore of the central member, the legs will gradually lift out of their respective holes until the respective stops on each retention member seat against the back of the circuit board. When fully installed, the stops are snugly positioned against the back of the circuit board and the bottom of the heat sink assembly is in the desired hand-adjusted tension with the heat generating surface to be cooled.

It is therefore an object of the present invention to provide a heat sink assembly which can accommodate a wide array of semiconductor device packages.

It is an object of the present invention to provide a heat sink assembly that can accommodate a semiconductor device mounted on a processor card.

It is a further object of the present invention to provide a heat sink assembly that can accommodate a semiconductor device without attaching to the device itself or the socket into which it is installed.

Another object of the present invention is to provide a heat sink assembly that can quickly and easily attach to a circuit board carrying a semiconductor device package.

It is a further object of the present invention to provide a heat sink assembly that can be hand-tightened to provide a custom tension between the heat sink member and the device to be cooled.

It is yet a further object of the present invention to provide a heat sink that can attach to and cool a heat generating surface.

BRIEF DESCRIPTION OF THE DRAWINGS

The novel features which are characteristic of the present invention are set forth in the appended claims. However, the inventions preferred embodiments, together with further objects and attendant advantages, will be best understood by reference to the following detailed description taken in connection with the accompanying drawings in which:

DETAILED DESCRIPTION OF THE PREFERRED EMBODIMENT

Figure 1:
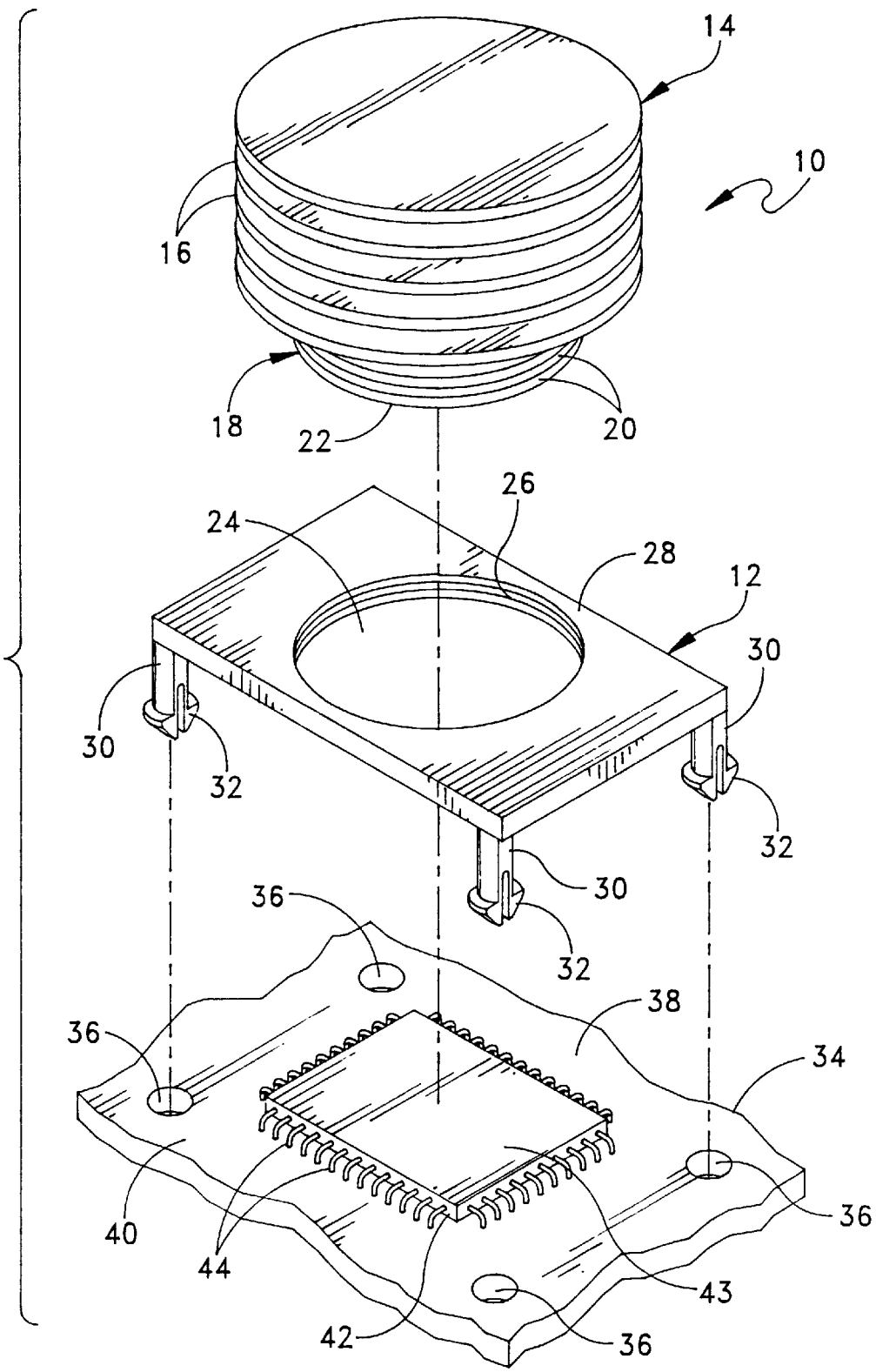
FIG. 1 is an exploded perspective view of the heat sink assembly of the present invention accommodating a semiconductor device installed on a circuit board.
Figure 6:
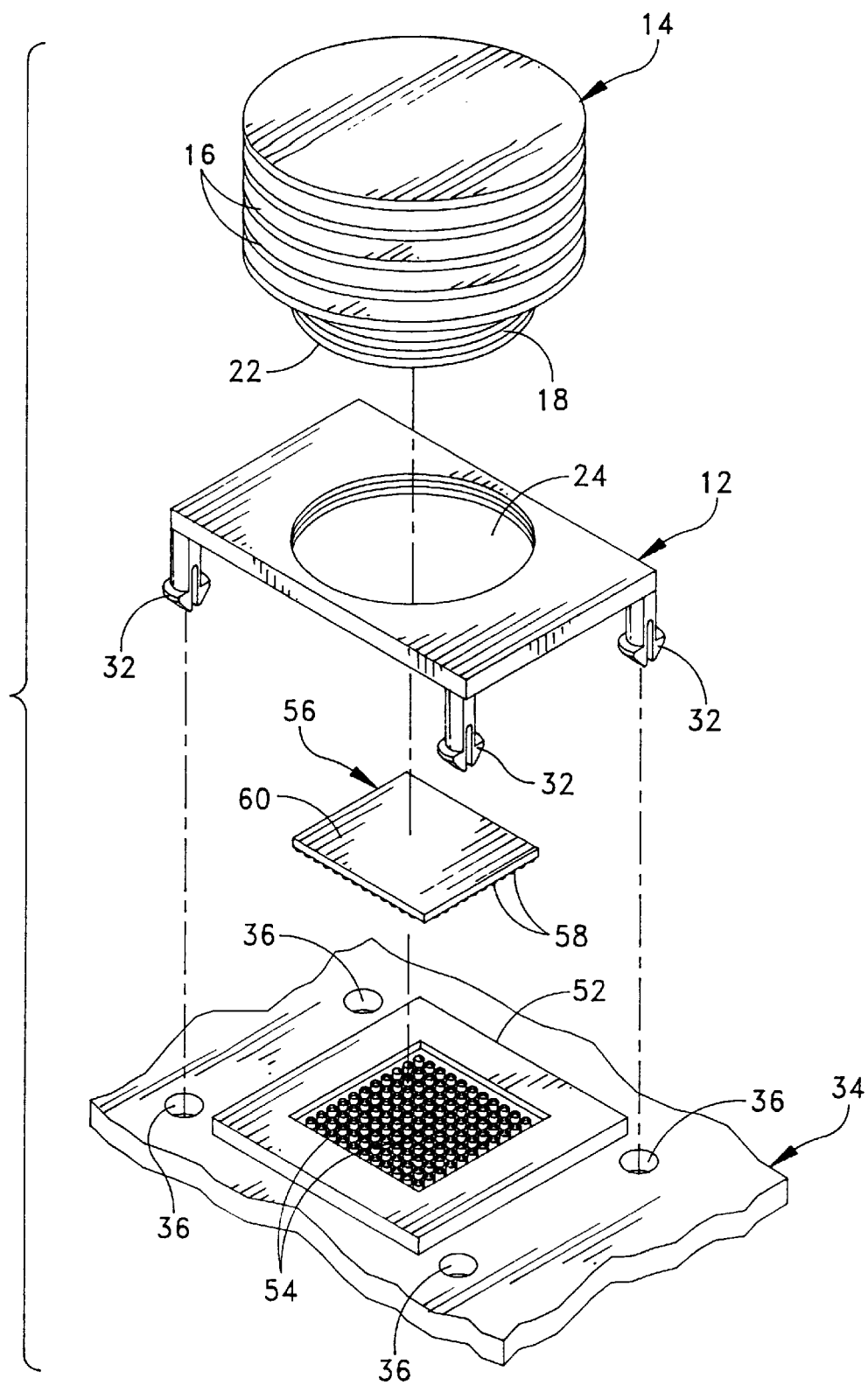
FIG. 6 an exploded perspective view of the heat sink assembly of the present invention illustrating the attachment to a BGA socket assembly on a circuit board.
Figure 7:
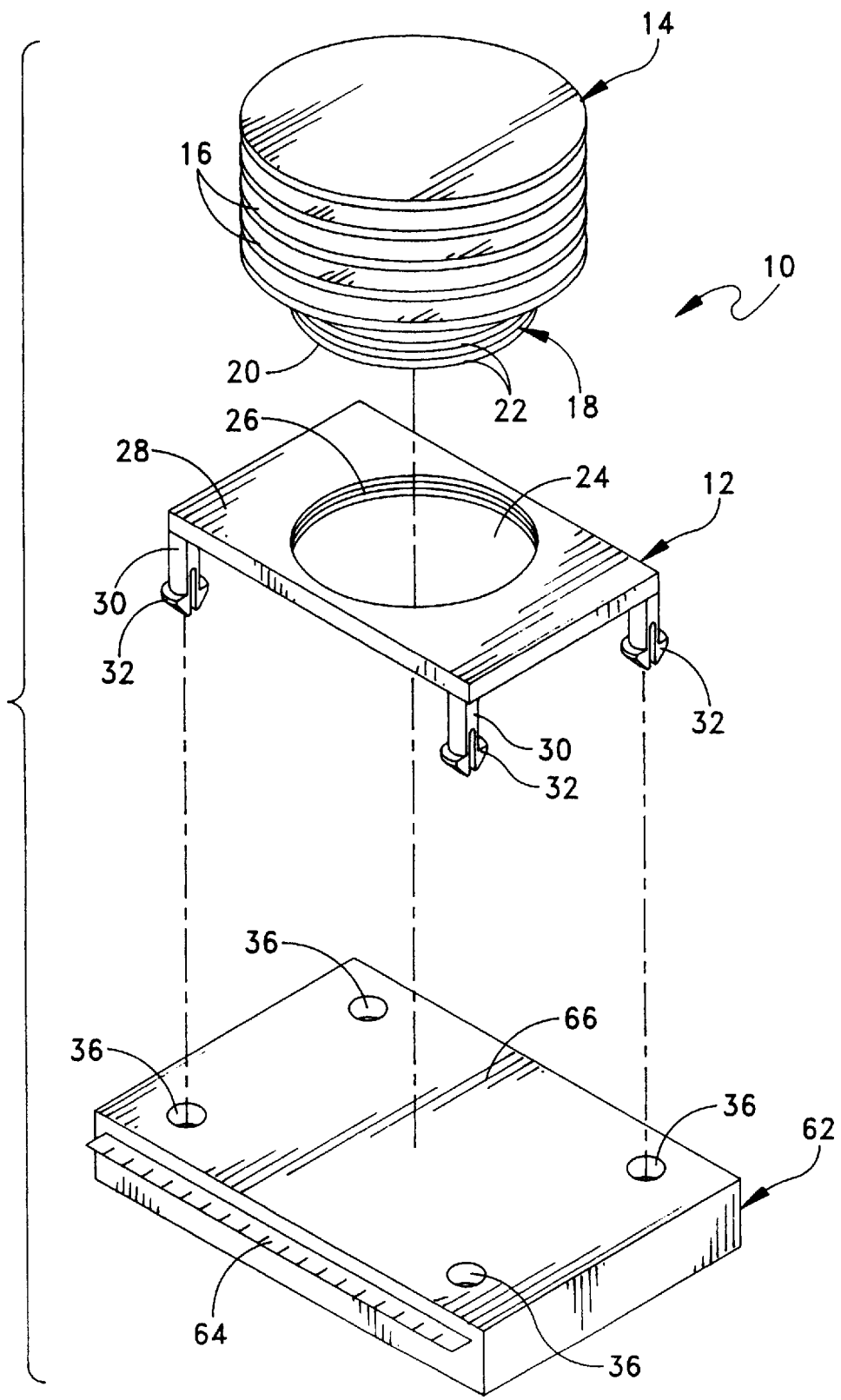
FIG. 7 is an exploded perspective view of the present invention illustrating the attachment to a heat generating surface.

Referring first to FIG. 1, the heat sink assembly 10 of the present invention is shown. It should be noted that the present invention provides a heat sink assembly 10 for attachment to any semiconductor device package attached to a circuit board with an array of holes completely therethrough or partially therethrough. The present invention is shown in FIGS. 1–5 as attaching to a surface mount semiconductor device package 42 is for illustration purposes only. It should be understood that various other types of semiconductor packages may be installed on a circuit board and accommodated by the present invention. FIG. 6, as discussed in detail below, illustrates the attachment of the present invention to a BGA semiconductor device package 56 within a BGA socket 52 to illustrate the flexibility of applications of the present invention. FIG. 7 shows a further application to attach to a heat generating surface.

Further, for ease of illustration, the following description addresses the attachment of the heat sink assembly of the present invention to a semiconductor package installed on a circuit board. This is intended to the include an a semiconductor arrangement where the circuit board is a "semiconductor card," such as a Pentium II or Celeron product, or where the circuit board is the motherboard or main circuit board itself. It further includes an arrangement, as in a Pentium II processor, where the circuit board is encased in a housing which includes holes therein. In this arrangement, an outer surface of the housing will generate heat, as shown in FIG. 7. The present invention is, therefore, suitable for dissipating heat generated by a given surface of an electronic component. As will be readily apparent, the heat sink assembly of the present invention can accommodate a wide range of semiconductor arrangements where holes are provided proximal to the package or surface to be cooled.

Referring to FIG. 1, the preferred embodiment of the heat sink assembly 10 of present invention is shown to include a clip 12 with a bore 24 positioned through central member 28. About the periphery of bore 24 are female threads 26. Downwardly depending from central member 28 are a number of legs 30, each including a free end with a retaining member 32 thereon. The length of legs 30 may be selected to accommodate the particular size of the member to be cooled. Details of retaining members 32 with be discussed in detail below. A heat dissipating member 14 is provided with a number of fins 16 and a base 18 with male threads 20 thereon. Base 18 further includes a bottom surface 22.

Heat sink assembly 10 is employed to dissipate heat from heat generating semiconductor device package 42 which includes a top surface 43 and is electrically interconnected to circuit board 34 via electrical interconnections 44. Circuit board 34, as commonly found in the industry, includes a number of holes 36 positioned about the semiconductor package 42 to be cooled. Clip 12 is illustrated to provide four downwardly depending legs 30 to communicated with corresponding four holes 36 through circuit board 34. It should be understood that the provision of four legs 30 and four corresponding receiving holes 36 is by way of example only and that fewer or greater than four legs 30 and corresponding receiving holes 36 may be provided in accordance with the application at hand.

Figure 2:
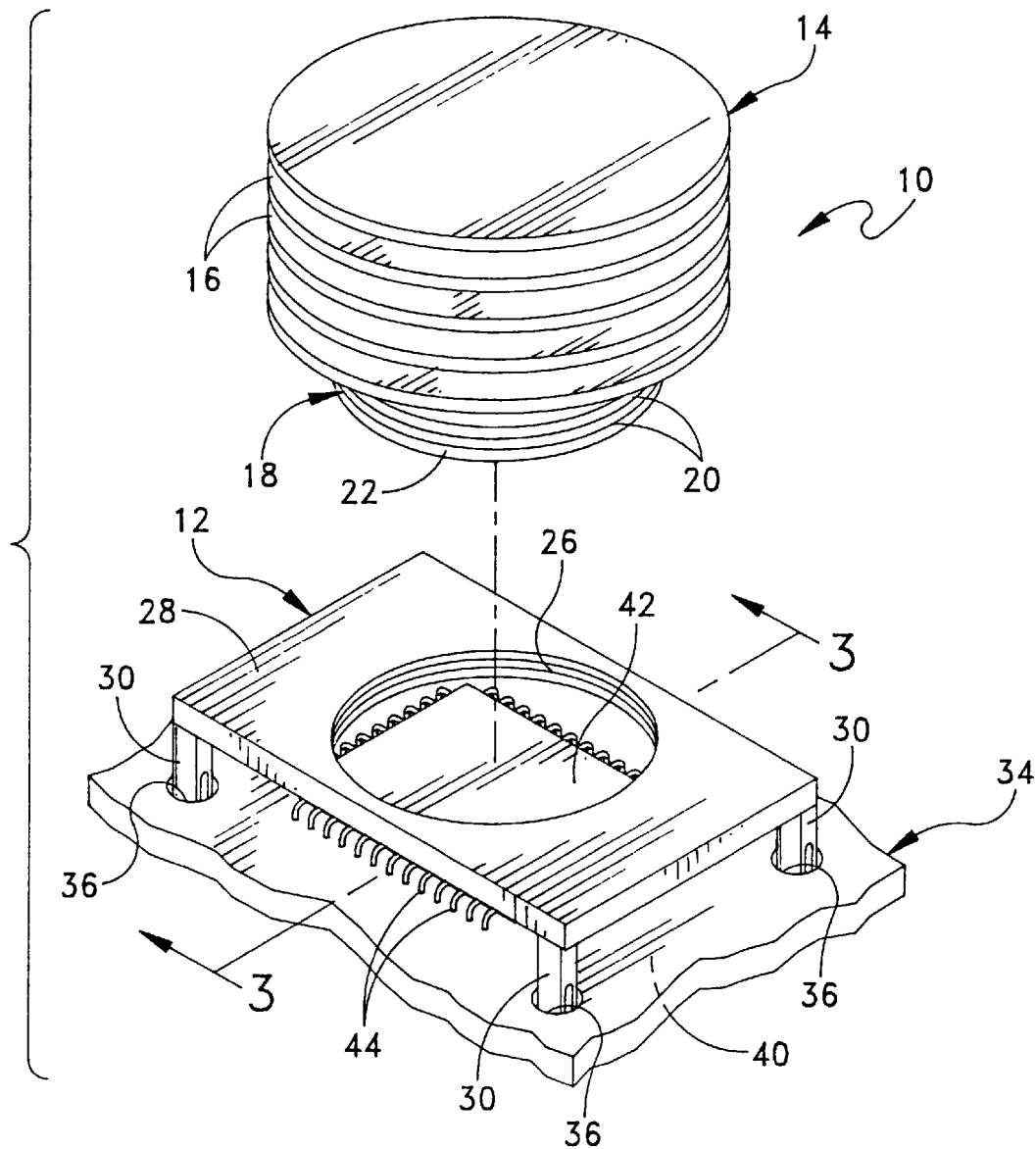
FIG. 2 is a partially assembled perspective view of the heat sink assembly of the present invention of FIG. 1 with clip member installed.
Figure 3:
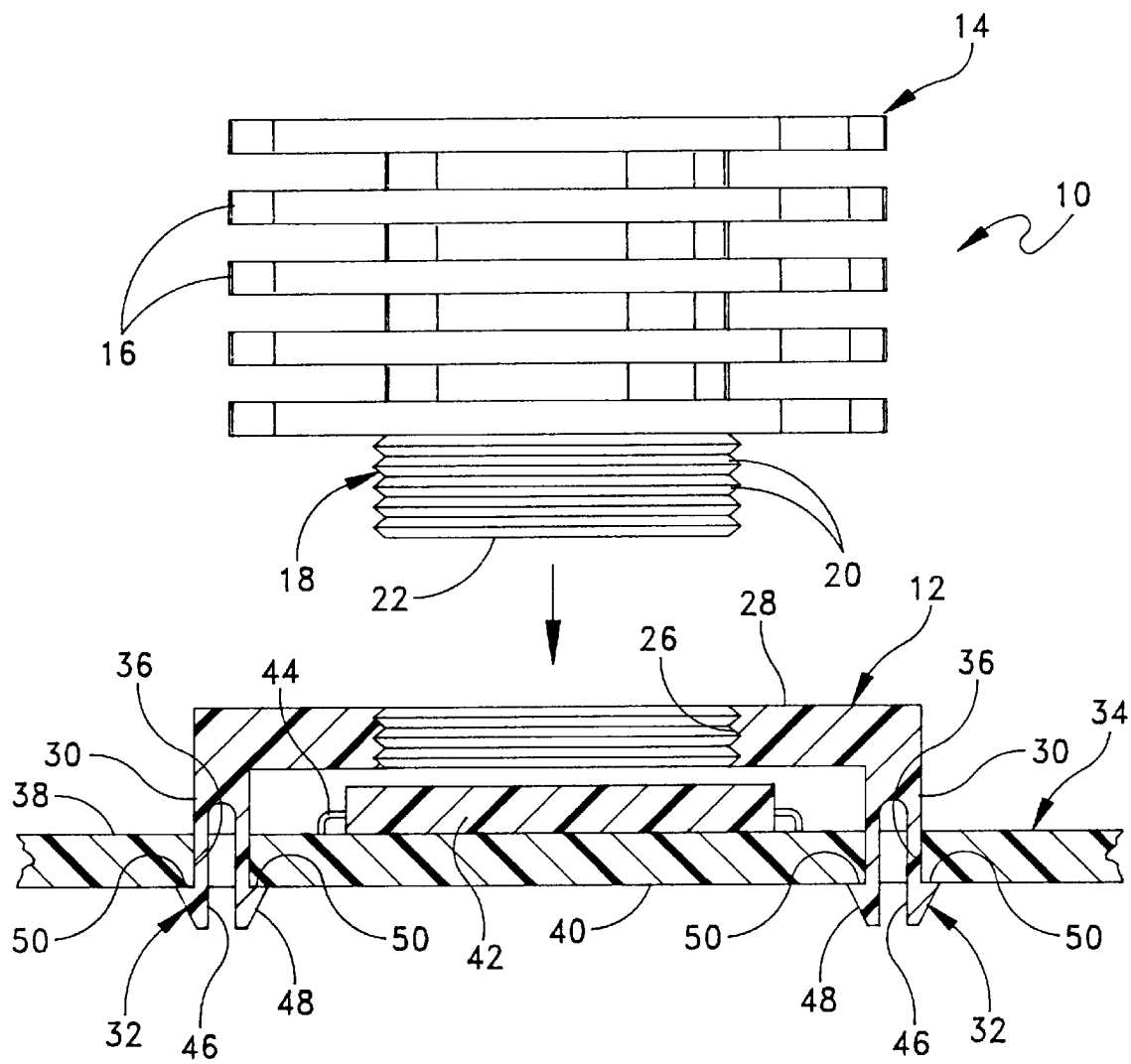
FIG. 3 is a partial cross-sectional view through the line 3—3 of FIG. 2.

Turning now to FIGS. 2–5, the installation and operation of the heat sink assembly 10 of the present invention is shown. FIG. 2 illustrates a perspective view of the clip 12 installed into circuit board 34 while FIG. 3 illustrates a cross-sectional view through the lines 3—3 of FIG. 2. Referring to both FIGS. 2 and 3, the installation of clip 12 is shown in detail. In particular, legs 30, depending from central member 28 of clip 12, have free ends which each have retaining members 32 thereat. The free ends of legs 30 are respectively routed through corresponding holes 36 in the circuit board 34 so that retaining members 32 of each leg 30 pass completely through respective holes 36. Legs 30 are routed through holes 36 and snap into their respective holes 36 into which they have been installed by passage of retaining members 32 through holes 36. Once retaining members 42 pass through respective holes 36, legs 30 are not easily capable of being removed from respective holes 36 but legs 30 are still slidable within holes 36.

As illustrated, retaining members 32 are shown a compressible members located at the free ends of legs 30. Each retaining member 32 preferably includes an angled head 48 with stop surfaces 50 at the top thereof. A central slot 46 is also provided to permit the entire retaining member 32 to compress thus allowing it to pass completely through hole 36. In particular, the passage of retaining members 32 through respective holes 36 provides stop members 50 at the bottom surface 40 of circuit board 34 to prevent removal of legs 30 from holes 36. In addition, retaining members 32 are shown as compressible members with a slot 46 and stops 50; however, other retaining member configurations are also within the scope of the invention. For example, the retaining members 32 may be made of compressible plastic so that slots 46 need not be used.

Figure 4:
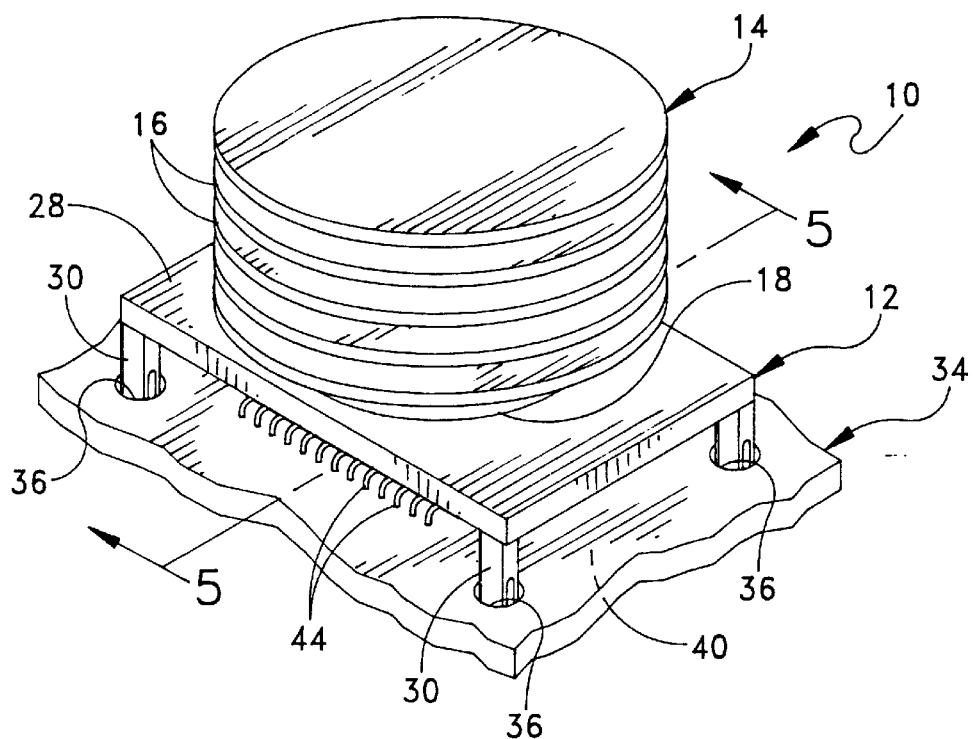
FIG. 4 is an assembled perspective view of the heat sink assembly of the present invention of FIG. 1.
Figure 5:
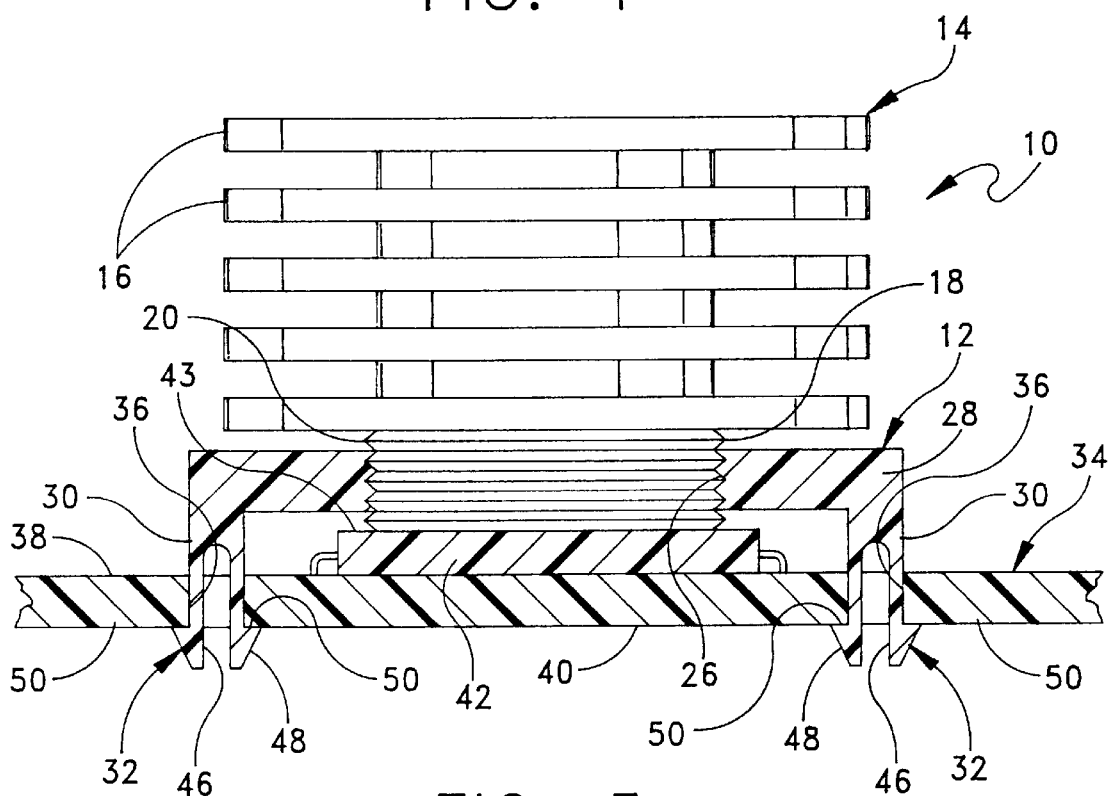
FIG. 5 is a partial cross-sectional view through the line 5—5 of FIG. 4.

Turning now to FIGS. 4 and 5, the installation of the heat dissipation member 14 and completion of the installation of the heat sink assembly 10 is shown. FIGS. 4 and 5 illustrate clip 12 installed into holes 36 in circuit board 34 along with base 18 of heat dissipating member 14 threadably received in bore 24. Male threads 20 on base 18 threadably engage with female threads 26 in bore 24. Base 18 is threadably routed through bore 24 so that its bottom surface 22 contacts the top surface 43 of semiconductor package 42 on circuit board 34. The length may be selected in accordance with the application. As base 18 is threaded into bore 24, stops 50 of retaining members 32 of each leg 30 contact the bottom surface 40 of circuit board 34 in a small region about the periphery of each respective hole 36. Such engagement of stops 50 and the bottom surface 40 of circuit board 34 prevents the removal of legs 30 as base 18 is easily hand-threaded through bore 24 and into contact with the top surface 43 of semiconductor package 42.

The bottom surface 22 of base 18 engages with the top surface 43 of semiconductor package 42 to provide a flush thermal communication between the heat dissipating member 14 and semiconductor package 42 to ensure efficient thermal transfer and dissipation. In particular, the tension of the communication of base 18 to semiconductor package 42 may be easily adjusted by clockwise or counterclockwise rotation of heat dissipation member 14 as desired.

FIG. 6 illustrates an alternative application of the heat sink assembly 10 to a BGA package and socket arrangement. In particular, circuit board 34 carries BGA socket 52 with contact array 54 thereon. Positioned about socket 52 is an array of holes 36. BGA package 56, with ball array 58, communicates with socket 52 and ball array 58 electrically communicates with contact array 54. As described above, clip 12 is installed into circuit board 34 with retaining members 32 engaging below holes 36. Base 18 is threaded into bore 24 so that bottom surface 22 of base 18 contacts top surface 60 of BGA package 56. Further threading of base 18 through bore 24 and into BGA package 56 not only provides a quality thermal connection between heat dissipating member 14 and BGA package 56 but also maintains BGA package in electrical connection between ball array 58 and contact array 54 of its socket 52.

As can be understood from the application in FIG. 6, the present invention has a wide range of applications and can be easily adapted for such applications. Further applications include any circuit board configuration where a heat generating device is provided on a circuit board or similar substrate and where a receiving structure, such as an array of holes, are provided. The present invention may be easily adapted to an application where the circuit board containing the heat generating device is encased in a housing, such as a Pentium II configuration. In this arrangement, as shown in FIG. 7, receiving structures, such as holes or slots 36, are provided in the housing 62 with electrical interconnect 64, which are capable of receiving the retaining members 32 of legs 30 so that heat dissipating member 14 can be placed in flush thermal communication with a heat generating region 66 of the surface of housing 62 which is proximal to the heat generating device contained therein.

It is preferred that the clips 12 be manufactured of plastic material, such as a high temperature resistant and high creep resistant plastic for better withstanding the high temperatures associated with microprocessors. For example, the plastic material clip 12 may be LNP VERTON UF-700-10-HS (P.P.A. 50% long fiber) for use in high temperate heat sink applications. Alternatively, clips 12 may be manufactured of metal, such as aluminum, depending on the application. In addition, heat dissipating member 14 is preferably metal, such as aluminum, for optimum thermal transfer and dissipation of heat from semiconductor device packages 42. Fins 16 are provided in a radial configuration but various other heat sink fin configurations, such as a pin grid array, may be employed.

It should be understood that all of the threaded components of the present invention may include various types of threads which are envisioned and are deemed to be within the scope of the present invention. These various thread designs include continuous and interrupted threads. It is preferred that there be at least more than one turn to facilitate the adjustment of pressure. However, a single turn 360° thread, as well as half and quarter turn thread are considered to be within the scope of the present invention due to the ability to impart any desired pressure. Further, bayonet-type attachment methods, which engage with ramped notches within a bore, are also considered to be threads which can provide a gradual, hand-controllable pressure in accordance with the present invention.

It would be appreciated by those skilled in the art that various changes and modifications can be made to the illustrated embodiments without departing from the spirit of the present invention. All such modifications and changes are intended to be covered by the appended claims.

What is claimed is:

1. A heat sink assembly for removing heat from an electronic component, comprising:

an electronic component having a heat generating surface and a plurality of mounting holes therein;

a retaining clip, having a central member and a number of legs, having a width, depending downwardly from said central member with ends of said legs not connected to said central member being free ends, an aperture disposed through said central member defining a bore with female threading therein; said bore being positioned substantially above said heat generating surface; said free ends of said legs being routable into corresponding holes in said electronic component;

retention members connected to each of said free ends of said legs; said retention members preventing said free ends of said legs from being withdrawn from said corresponding holes in said electronic component; and a heat dissipating member having a threaded base portion with a substantially flat bottom surface adapted to be threadably received in said bore so that said flat bottom surface of said heat dissipating member is in flush thermal communication with said heat generating surface of said electronic component while said legs are secured within their respective holes in said electronic component.

2. The heat sink assembly of claim 1, wherein each of said retention members include a number of stops; said stops communicating with said electronic component about said holes.

3. The heat sink assembly of claim 2, wherein said free ends of said legs are compressible at their respective free ends permitting clearance of said stops upon routing of said free ends of said legs into corresponding holes in electronic component.

4. The heat sink assembly of claim 2 wherein said legs further define a slot extending upwardly from their respective free ends a predetermined distance and across the entire width of said legs; said legs being compressible at their respective free ends permitting clearance of said stops upon routing of said free ends of said legs into corresponding holes in said electronic component.

5. The heat sink assembly of claim 1, wherein said electronic component is a processor card installable on a motherboard.

6. The heat sink assembly of claim 1, wherein said electronic component is a semiconductor device package.

7. The heat sink assembly of claim 1, wherein said electronic component is a ball grid array semiconductor device.

8. The heat sink assembly of claim 1, wherein said semiconductor device package is a surface mounted semiconductor device package.

9. The heat sink assembly of claim 1, wherein said electronic component includes four holes and said retaining clip includes four legs receivable in corresponding holes in said electronic component.

10. The heat sink assembly of claim 1, wherein said retaining clip is manufactured of plastic.

11. The heat sink assembly of claim 1, wherein said heat dissipating member is manufactured of metal.

12. The heat sink assembly of claim 1, wherein the tension of the communication between the heat dissipating member and the electronic component is adjustable.

13. A heat sink assembly for removing heat from a semiconductor device package, comprising:

a semiconductor device package having an upper surface;

a circuit board having a top side and a bottom side and a plurality of mounting holes therethrough; said semiconductor device package being installed on said top side of said circuit board;

a retaining clip, having a central member and a number of legs, having a width, depending downwardly from said central member with ends of said legs not connected to said central member being free ends, an aperture disposed through said central member defining a bore; female threading formed in said bore; said bore being positioned substantially above said semiconductor package installed on said top side of said circuit board; said free ends of said legs being routable into corresponding holes through said circuit board;

retention members connected to each of said free ends of said legs; said retention members preventing said free ends of said legs from being withdrawn from said corresponding holes through said circuit board; said retention members each including a number of outwardly extending flanges having respective top surfaces; said top surfaces of said flanges communicating with said bottom surface of said circuit board onto which said semiconductor device package is not installed; said free ends of said legs being compressible at their respective free ends permitting clearance of said flanges upon routing of said free ends of said legs into corresponding holes through said circuit board; said legs each including a slot extending upwardly from their respective free ends a predetermined distance and across the entire width of said legs thus facilitating compression of said legs at their respective free ends; and a heat dissipating member having a threaded base portion with a substantially flat bottom surface adapted to be threadably received in said bore so that said flat bottom surface of said heat dissipating member is in flush thermal communication with an upper surface of said semiconductor device installed in said circuit board while said legs are secured within their respective holes in said circuit board.

14. The heat sink assembly of claim 13, wherein said circuit board is a processor card installable on a motherboard.

15. The heat sink assembly of claim 13, wherein said semiconductor device package is a ball grid array semiconductor device.

16. The heat sink assembly of claim 13, wherein said semiconductor device package is a surface mounted device.

17. The heat sink assembly of claim 13, wherein said circuit board includes four holes and said retaining clip includes four legs receivable in corresponding holes in said circuit board.

18. The heat sink assembly of claim 13, wherein said retaining clip is manufactured of plastic.

19. The heat sink assembly of claim 13, wherein said heat dissipating member is manufactured of metal.

20. The heat sink assembly of claim 13, wherein the tension of the communication of the heat dissipating member and the semiconductor device package is adjustable.

* * * * *